United States Patent
Kita

(10) Patent No.: US 11,846,657 B2
(45) Date of Patent: Dec. 19, 2023

(54) CURRENT DETECTION APPARATUS, CURRENT DETECTION METHOD, CURRENT CONTROL APPARATUS, AND CURRENT CONTROL METHOD

(71) Applicant: KABUSHIKI KAISHA YASKAWA DENKI, Kitakyushu (JP)

(72) Inventor: Hiroyuki Kita, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 186 days.

(21) Appl. No.: 17/668,383

(22) Filed: Feb. 10, 2022

(65) Prior Publication Data

US 2022/0268814 A1    Aug. 25, 2022

(30) Foreign Application Priority Data

Feb. 22, 2021    (JP) .................. 2021-026216

(51) Int. Cl.
   *G01R 15/20* (2006.01)
   *G01R 15/14* (2006.01)
   (Continued)

(52) U.S. Cl.
   CPC ......... *G01R 15/202* (2013.01); *G01R 15/146* (2013.01); *G01R 19/0092* (2013.01); *G06N 7/01* (2023.01)

(58) Field of Classification Search
   CPC ............... G01R 15/202; G01R 15/146; G01R 19/0092; G01R 19/2506; G01R 1/203; G06N 7/01; G05F 1/625
   See application file for complete search history.

(56) References Cited

U.S. PATENT DOCUMENTS

2016/0341772 A1    11/2016 Roberts et al.
2021/0048454 A1*    2/2021 Choi .................. G01R 31/3842

FOREIGN PATENT DOCUMENTS

JP    H08-145714    6/1996
JP    2009-281773    12/2009
(Continued)

OTHER PUBLICATIONS

Japanese Office Action for corresponding JP Application No. 2021-026216, dated May 31, 2022 (w/ English machine translation).

*Primary Examiner* — Farhana A Hoque
(74) *Attorney, Agent, or Firm* — MORI & WARD, LLP

(57) ABSTRACT

A current detection apparatus includes first current detection circuitry configured to detect a current flowing through a conductive wire with a shunt resistor connected to the conductive wire to obtain a first detected current value; second current detection circuitry configured to detect the current with a Hall element to obtain a second detected current value; a storage configured to store a first probability distribution information of the first current detection circuitry and a second probability distribution information of the second current detection circuitry; synthesis circuitry configured to convert the first and second detected current values into first and second probability distributions based on the first and second probability distribution information, respectively, and to synthesize the first and second probability distributions to obtain a synthesized distribution; and estimation circuitry configured to obtain an estimated current value via a maximum likelihood estimation based on the synthesized distribution.

10 Claims, 8 Drawing Sheets

(51) Int. Cl.
  *G01R 19/00* (2006.01)
  *G06N 7/01* (2023.01)

(56) References Cited

FOREIGN PATENT DOCUMENTS

| | | |
|---|---|---|
| JP | 2009-281774 | 12/2009 |
| WO | WO 2020/106044 | 5/2020 |

* cited by examiner

FIG. 7

| Example | First Detection Element | Second Detection Element | Detection Target | Performance |
|---|---|---|---|---|
| 1 | Shunt Resistor | Hall element | Alternating Current, Direct Current | ○ |
| 2 | Shunt Resistor | Current Transformer | Direct Current | ○ |
| 3 | Current Transformer | Hall element | Direct Current | △ |

CURRENT DETECTION APPARATUS, CURRENT DETECTION METHOD, CURRENT CONTROL APPARATUS, AND CURRENT CONTROL METHOD

CROSS-REFERENCE TO RELATED APPLICATIONS

The present application claims priority under 35 U.S.C. § 119 to Japanese Patent Application No. 2021-026216, filed Feb. 22, 2021. The contents of this applications are incorporated herein by reference in their entirety.

BACKGROUND OF THE INVENTION

Field of the Invention

The disclosed embodiments relate to a current detection apparatus, a current detection method, a current control apparatus, and a current control method.

Discussion of the Background

Conventionally, a current detection apparatus that detects a current using a shunt resistor and a current detection apparatus that detects a current using a Hall element are known. A current control apparatus that controls an output current by using a current detected by the current detection apparatus as a feedback value is also known.

Japanese Patent Application Laid-Open No. 2009-281774 shows a current detection apparatus including both the shunt resistor and the Hall element has also been proposed.

SUMMARY OF THE INVENTION

According to one aspect of the present invention, a current detection apparatus includes first current detection circuitry configured to detect a current flowing through a conductive wire with a shunt resistor connected to the conductive wire to obtain a first detected current value; second current detection circuitry configured to detect the current with a Hall element to obtain a second detected current value; a storage configured to store a first probability distribution information indicating uncertainty of a detected current value detected by the first current detection circuitry and a second probability distribution information indicating uncertainty of a detected current value detected by the second current detection circuitry; synthesis circuitry configured to convert the first detected current value into a first probability distribution based on the first probability distribution information, to convert the second detected current value into a second probability distribution based on the second probability distribution information, and to synthesize the first probability distribution and the second probability distribution to obtain a synthesized distribution; and estimation circuitry configured to obtain an estimated current value via a maximum likelihood estimation based on the synthesized distribution.

According to another aspect of the present invention, a current detection method includes detecting a current flowing through a conductive wire with a shunt resistor connected to the conductive wire to obtain a first detected current value, detecting the current with a Hall element to obtain a second detected current value, storing a first probability distribution information indicating uncertainty of a detected current value detected by the first current detection circuitry and a second probability distribution information indicating uncertainty of a detected current value detected by the second current detection circuitry, converting the first detected current value into a first probability distribution based on the first probability distribution information, converting the second detected current value into a second probability distribution based on the second probability distribution information, synthesizing the first probability distribution and the second probability distribution to obtain a synthesized distribution, and obtaining an estimated current value via a maximum likelihood estimation based on the synthesized distribution.

According to the other aspect of the present invention, a current control method includes, detecting a current flowing through a conductive wire with a shunt resistor connected to the conductive wire to obtain a first detected current value, detecting the current with a Hall element to obtain a second detected current value, storing a first probability distribution information indicating uncertainty of a detected current value detected by the first current detection circuitry and a second probability distribution information indicating uncertainty of a detected current value detected by the second current detection circuitry, converting the first detected current value into a first probability distribution based on the first probability distribution information, converting the second detected current value into a second probability distribution based on the second probability distribution information, synthesizing the first probability distribution and the second probability distribution to obtain a synthesized distribution, obtaining an estimated current value via a maximum likelihood estimation based on the synthesized distribution, and controlling an output current based on the estimated current value.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings.

FIG. 7 is a diagram showing an example of a combination of detection elements.

DESCRIPTION OF THE EMBODIMENTS

Hereinafter, embodiments of a current detection apparatus, a current detection method, a current control apparatus, and a current control method disclosed in the present application will be described in detail with reference to the accompanying drawings. Note that the present invention is not limited to the embodiments described below.

Figure 1:
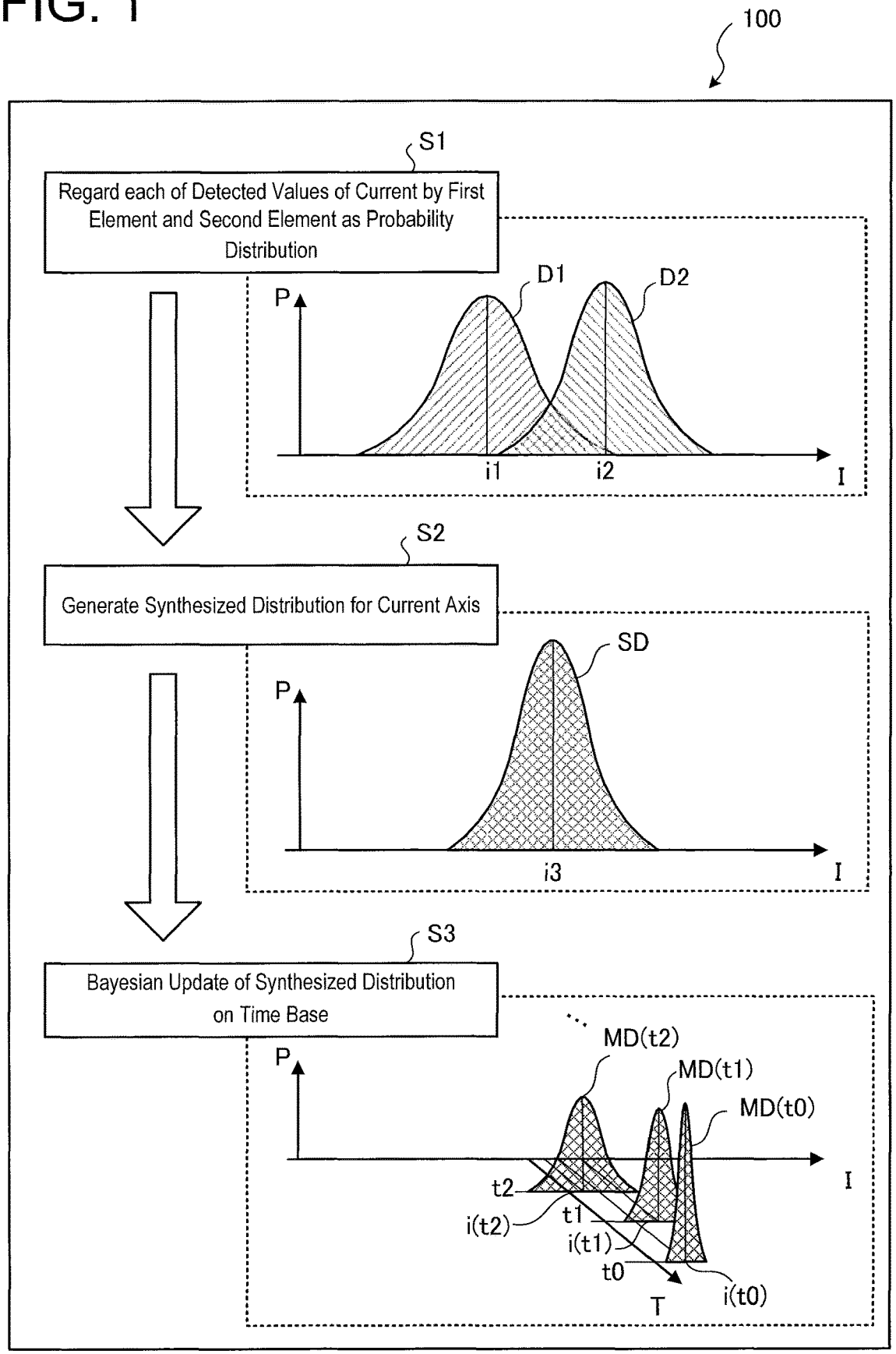
FIG. 1 is a schematic diagram illustrating an overview of a current detection apparatus according to an embodiment.

First, a current detection apparatus according to an embodiment will be described with reference to FIG. 1. FIG. 1 is a schematic diagram illustrating an overview of a current detection apparatus according to an embodiment. A specific configuration of the current detection apparatus will be described later with reference to FIGS. 2 and 3.

As shown in FIG. 1, the current detection apparatus respectively detects a current flowing through a conductive wire to be targeted for detection by a first element and a second element having different characteristics. The first element is, for example, a shunt resistor, and the second element is, for example, a Hall element. Note that the horizontal axis of each graph indicated by a broken line frame in each step (step S1, step S2, and step S3) in FIG. 1 represents current (I), and the vertical axis represents probability (P).

Here, the shunt resistor measures a voltage difference between both ends of the resistor and detects a current in accordance with Ohm's law, but has a defect that an output is multiplied by noise due to an ambient temperature or self-heating. The Hall element measures a magnetomotive force generated around an electric current and detects the electric current in a non-contact manner according to Ampere's law, but has a drawback that an output is multiplied by surrounding electromagnetic noise.

As described above, since the shunt resistor and the Hall element have the above-described disadvantages, when each of them is used alone, it cannot be said that the current detection accuracy is sufficiently high, and there is room for improvement from the viewpoint of the detection accuracy.

Therefore, in the current detection apparatus according to the embodiment, the current flowing through the conductive wire is detected by the first element and the second element having different characteristics, and the detected value is treated as the probability distribution D. Then, the maximum likelihood estimation of the current is performed based on the synthesized distribution obtained by synthesizing the probability distributions.

Here, as the first element and the second element, it is preferable to use a combination of elements having different causes of accuracy deterioration, such as a combination of a shunt resistor and a Hall element. By using elements having different characteristics as described above, defects can be compensated for each other, and detection accuracy can be easily improved.

In addition, the above-described "probability distribution" corresponds to a statistical distribution in which a current value measured via each element is an average ($\mu$) and a normal distribution having a variation of a standard deviation ($\sigma$) is set. That is, it can be said that the probability distribution indicates the uncertainty of each of the detected values by each element. The standard deviation ($\sigma$) of the current value measured via each element can be obtained from a catalog value of each element or can be obtained based on an experiment. The probability distribution may be referred to as a "probability distribution function".

Further, in the current detection apparatus 100 according to the embodiment, in addition to the maximum likelihood estimation of the current based on the synthesized distribution, the maximum likelihood estimation of the current is performed based on an updated distribution obtained by Bayesian updating of the current synthesized distribution with the past synthesized distribution.

Hereinafter, the above-described processing contents will be specifically described. First, the current detection apparatus regards each of the detected values of the current by the first element and the second element as probability distributions D (step S1). To be more specific, it is assumed that the current value detected by the first element is "i1" as indicated by a broken line frame in "step S1". In this case, the current detection apparatus treats the detected value by the first element as a "probability distribution D1" in which the i1 is an average ($\mu$) and a standard deviation ($\sigma$) corresponding to the first element.

Similarly, it is assumed that the current value detected by the second element is "i2". In this case, the current detection apparatus 100 treats the detected value by the second element as a "probability distribution D2" in which the i2 is an average ($\mu$) and a standard deviation ($\sigma$) corresponding to the second element. In this way, the detected values of the elements can be combined in a statistically valid form by treating the detected values as not simple values but as a probabilistic distribution representing the uncertainty of each of the detected values.

Next, the current detection apparatus 100 generates a synthesized distribution SD for the current axis (I-axis) (step S2). To be more specific, as indicated by broken line frame in "step S2", the probability distributions D1 indicated in the step S1 are synthesized with the probability distributions D2, that is, the probability distributions D1 and D2 are synthesized on the probability axes (P-axes) to generate the synthesized distribution SD. Here, the average ($\mu$) of the synthesized distribution SD is defined as "i3". The current detection apparatus 100 may use "i3" as the output value.

Subsequently, the current detection apparatus performs Bayesian update of the synthesized distribution SD on the time base (T-axis) (step S3). To be specific, as indicated by a broken line frame in "Step S3", updated distributions MDs are sequentially generated by Bayesian updating of the current synthesized distribution SD with the past synthesized distribution SD. Then, the current detection apparatus 100 outputs a current value which is an average ($\mu$) of the updated distribution MD which is a result of the Bayesian update.

Here, Bayesian Updating refers to a known method of increasing the accuracy of estimation by updating an estimated value in accordance with information when the information is updated at any time. Bayesian update may be referred to as sequential Bayesian estimation.

In the step S3, the current time is exemplified as t0, the previous time is exemplified as t1, and the time before last is exemplified as t2. Describing in time series, the synthesized distribution MD in t2 is the synthesized distribution MD (t2), the synthesized distribution MD in t1 is the synthesized distribution MD (t1), and the synthesized distribution MD in t0 is the synthesized distribution MD (t0). Further, the output value in t2 is i (t2), the output value in t1 is i (t1), and the output value in t0 is i (t0).

As shown in step S3, the standard deviation ($\sigma$) in each synthesized distribution MD decreases as the Bayesian update is repeated, that is, the spread of the normal distribution in the direction of the current axis (I-axis) decreases, so that the accuracy of current detection can be increased. In this way, by performing maximum likelihood in the direction of the time axis, it is possible to further increase the accuracy of current detection.

Figure 2:
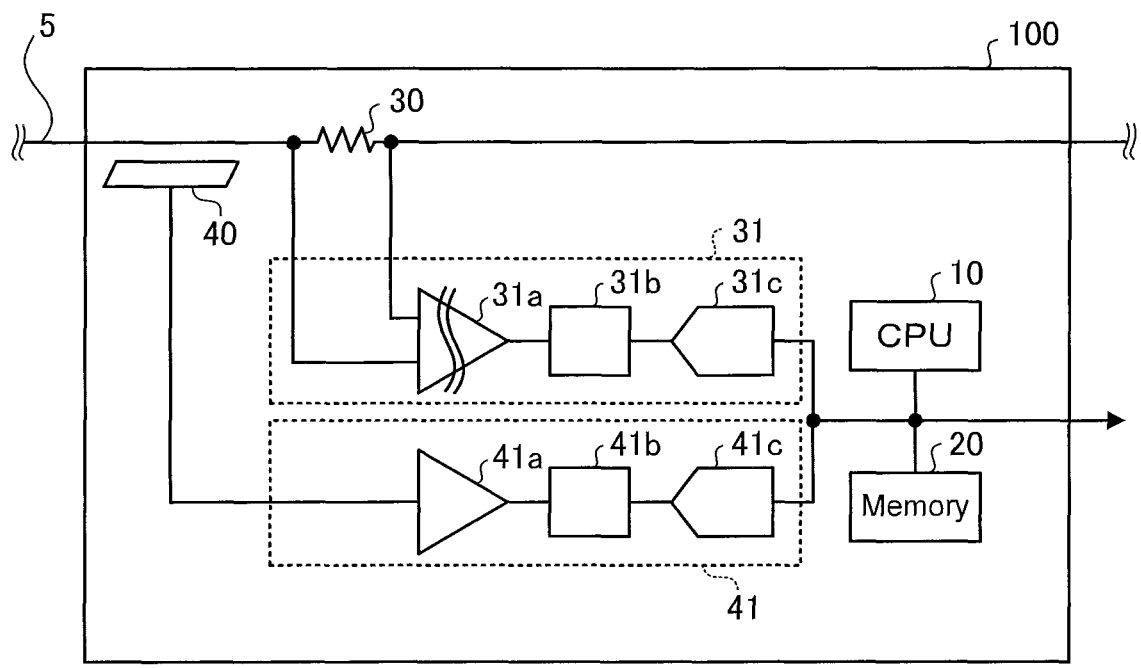
FIG. 2 is a schematic diagram showing a configuration example of a circuit.

Next, an example of a circuit configuration of the current detection apparatus 100 shown in FIG. 1 will be described with reference to FIG. 2. FIG. 2 is a schematic diagram showing a configuration example of a circuit. As shown in FIG. 2, a shunt resistor 30 is provided on a conductive wire 5 as a current detection target, and a Hall element 40 is provided so as to be in non-contact with the conductive wire 5. In the case shown in FIG. 2, the shunt resistor 30 and the Hall element 40 are disposed close to each other. With this arrangement, the size of the current detection apparatus 100 can be reduced.

The Hall element 40 is not necessarily disposed in the vicinity of the shunt resistor 30. That is, since both elements can acquire the same current value as long as they are provided along the conductive wire 5 to be targeted for detection, the shunt resistor 30 and the Hall element 40 may be apparently separated from each other. Here, the Hall element 40 is an IC type Hall element 40 and can detect not only an alternating current but also a direct current.

An isolation amplifier 31a, a first phase shifter (an example of "first phase shifting circuitry") 31b, and an AD converter 31c are provided in order from the upstream side on a first output line 31 which is an output line of the shunt resistor 30. The isolation amplifier 31a is an amplifier that electrically isolates analog input signals and output signals from each other, and amplifies a voltage difference between both ends of the shunt resistor 30.

The first phase shifter 31b delays the phase of the output waveform of the isolation amplifier 41a by an arbitrary time in order to match the phase of the output waveform of the amplifier 31a of the second output line 41. The AD converter 31c converts analog input signals into digital output signals.

The second output line 41, which is an output line of the Hall element 40, is provided with an amplifier 41a, a second phase shifter (an example of "second phase shifting circuitry") 41b, and an AD converter 41c in this order from the upstream side. The amplifier 41a amplifies an output value of the Hall element 40. The second phase shifter 41b delays the phase of the output of the amplifier 41a by an arbitrary time in order to match the phase of the output waveform of the isolation amplifier 31a of the first output line 31. The AD converter 41c converts analog input signals into digital output signals.

As described above, in the current detection apparatus 100, the phase shifters are provided in both the first output line 31 corresponding to the shunt resistor 30 and the second output line 41 corresponding to the Hall element 40. Therefore, even if either the system of the shunt resistor 30 or the system of the Hall element 40 is phase-delayed, phase matching can be performed, so that the present invention can be applied to not only DC current detection but also AC current detection without any problem. When the detection target is a direct current, the phase shifter of one of the first output line 31 and the second output line 41 may be omitted.

Further, as shown in FIG. 2, the first output line 31 and the second output line 41 merge on the downstream side, and a CPU (Central Processing Unit) 10 and a memory 20 are provided at the merging destination. The output value generated by the CPU10 is output to the outside. The CPU10 and the memory 20 correspond to a control unit 10 and a storage unit 20 in FIG. 3 described later, respectively.

As shown in FIG. 2, each of the first output line 31 and the second output line 41 does not include a noise filter. This is because, as described above, the current detection apparatus 100 performs maximum likelihood estimation of the output value by combining the probability distributions of the two systems, and thus it is possible to suppress the influence of noise. In this way, by omitting the noise filter, it is possible to reduce the cost and size of the current detection apparatus 100.

Figure 3:
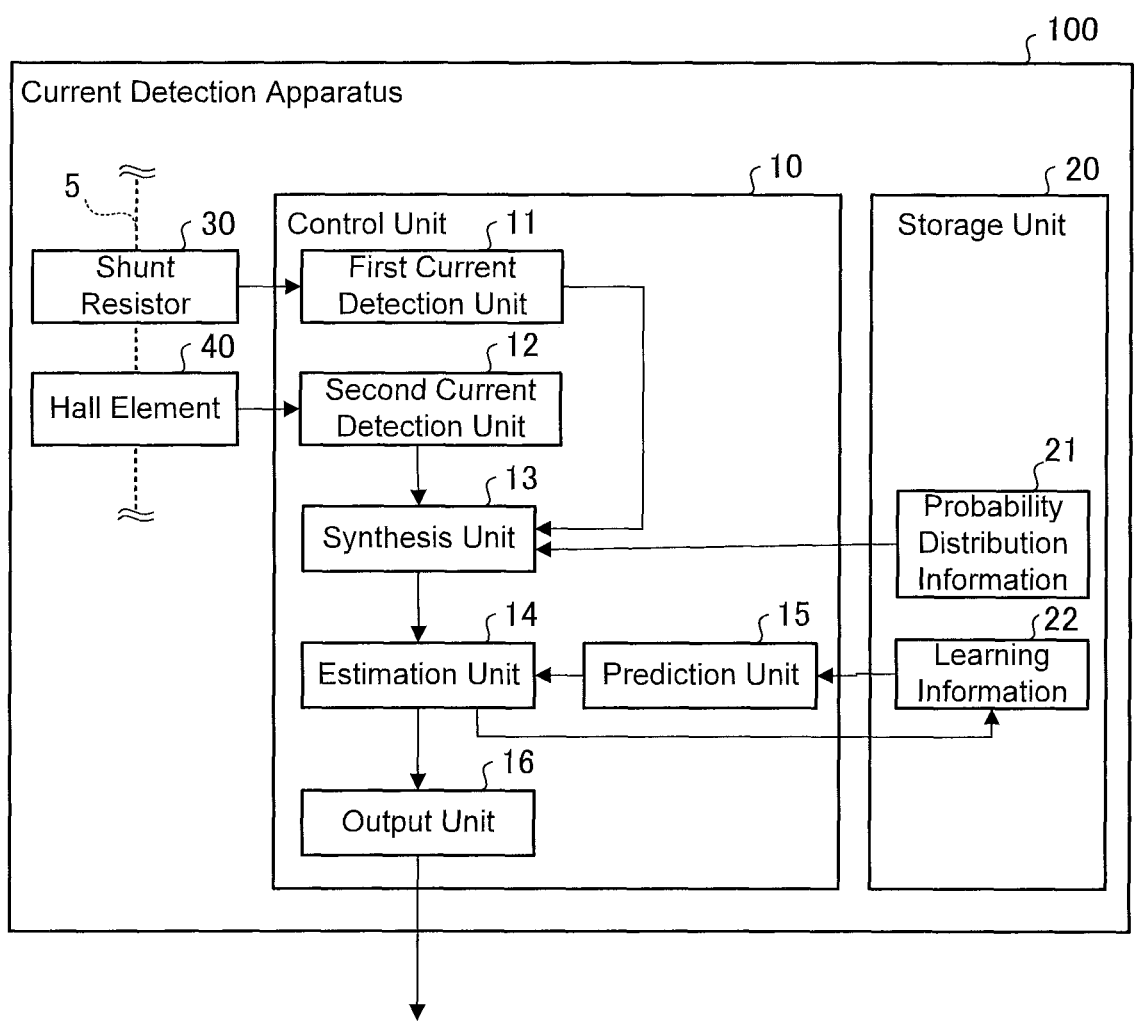
FIG. 3 is a block diagram showing a configuration of the current detection apparatus.

Next, a configuration of the current detection apparatus 100 will be described with reference to FIG. 3. FIG. 3 is a block diagram showing a configuration of the current detection apparatus 100. In FIG. 3, the first output line 31 and the second output line 41 shown in FIG. 2 are not shown.

As shown in FIG. 3, the current detection apparatus 100 includes a control unit 10, a storage unit 20, a shunt resistor 30, and a Hall element 40. Since the shunt resistor 30 and the Hall element 40 have already been described with reference to FIG. 2, the description thereof is omitted here.

The control unit 10 includes a first current detection unit (an example of "first current detection circuitry") 11, a second current detection unit (an example of "second current detection circuitry") 12, a synthesis unit (an example of "synthesis circuitry") 13, an estimation unit (an example of "estimation circuitry") 14, a prediction unit (an example of "prediction circuitry") 15, and an output unit 16. The storage unit (an example of "storage") 20 stores probability distribution information 21 and learning information 22.

Here, the control unit 10 includes, for example, a computer having a central processing unit (CPU), a read only memory (ROM), a random access memory (RAM), a hard disk drive (HDD), an input/output port, and the like, and various circuits.

For example, the CPU of the computer functions as the first current detection unit 11, the second current detection unit 12, the synthesis unit 13, the estimation unit 14, the prediction unit 15, and the output unit 16 of the control unit 10 by reading and executing a program stored in the ROM.

Further, at least one or all of the first current detection unit 11, the second current detection unit 12, the synthesis unit 13, the estimation unit 14, the prediction unit 15, and the output unit 16 of the control unit 10 may be configured by hardware such as an application specific integrated circuit (ASIC) or a field programmable gate array (FPGA).

The storage unit 20 corresponds to, for example, a RAM or an HDD. The RAM or the HDD can store the probability distribution information 21 and the learning information 22. Note that the control unit 10 may acquire the above-described programs and various types of information via another computer or portable recording medium connected via a wired or wireless network.

The first current detecting unit 11 outputs the current value of the system of the shunt resistor 30 to the synthesis unit 13. Further, the second current detection unit 12 outputs the current value of the system of the Hall element 40 to the synthesis unit 13. Note that the shunt resistor 30 and the Hall element 40 may be in any positional relationship with each other as long as the shunt resistor 30 and the Hall element 40 are located on the conductive wire 5 as a current detection target.

Based on the probability distribution information 21 of the storage unit 20, the synthesis unit 13 converts the current value of the system of the shunt resistor 30 into a probability distribution and converts the current value of the system of the Hall element 40 into a probability distribution. Then, the synthesis unit 13 generates a synthesized distribution by synthesizing the probability distributions, and outputs the generated synthesized distribution to the estimation unit 14. Note that more specific processing contents of the synthesis unit 13 will be described later using FIG. 4A and FIG. 4B.

The estimation unit 14 performs maximum likelihood estimation of current based on the synthesized distribution obtained by the synthesis unit. Specifically, the estimation unit 14 generates a maximum likelihood distribution by combining the predicted distribution obtained by the prediction unit 15 and the synthesized distribution received from the synthesis unit 13. Then, the estimation unit 14 outputs the average ($\mu$) of the generated maximum likelihood distribution to the output unit 16 as an estimated current (an estimated current value), and stores the generated maximum likelihood distribution in the storage unit 20 as the learning information 22 in association with time information.

The prediction unit 15 generates a predicted synthesized distribution obtained by predicting the current synthesized distribution based on the learning information 22, and outputs the generated predicted distribution to the estimation unit 14. More specific processing contents of the estimation unit 14 and the prediction unit 15 will be described later with reference to FIG. 5. Further, the output unit 16 outputs the estimated current received from the estimation unit 14 to the outside.

The probability distribution information 21 is information including a variance (a) of current values measured via the shunt resistor 30 and a variance (a) of current values measured via the Hall element 40. Here, the probability distribution information 21 may be simply referred to as "probability distribution 21". Further, the learning information 22 is information in which a maximum likelihood distribution generated in the past by the estimation unit 14 is associated with time. Note that the learning information 22 may be only information of the maximum likelihood distribution generated immediately before or may include information of a plurality of maximum likelihood distributions in time series.

Figure 4A:
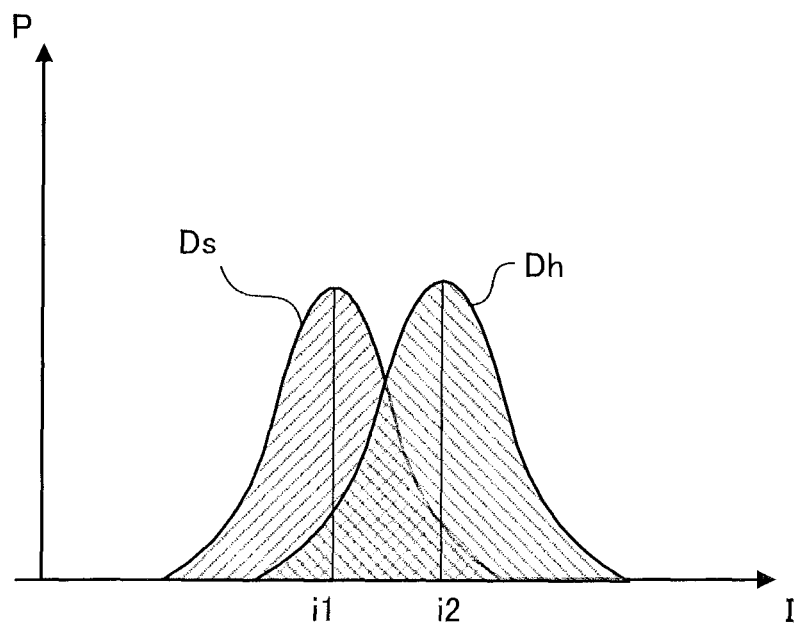
FIG. 4A is a diagram 1 illustrating processing contents of the synthesis unit.
Figure 4B:
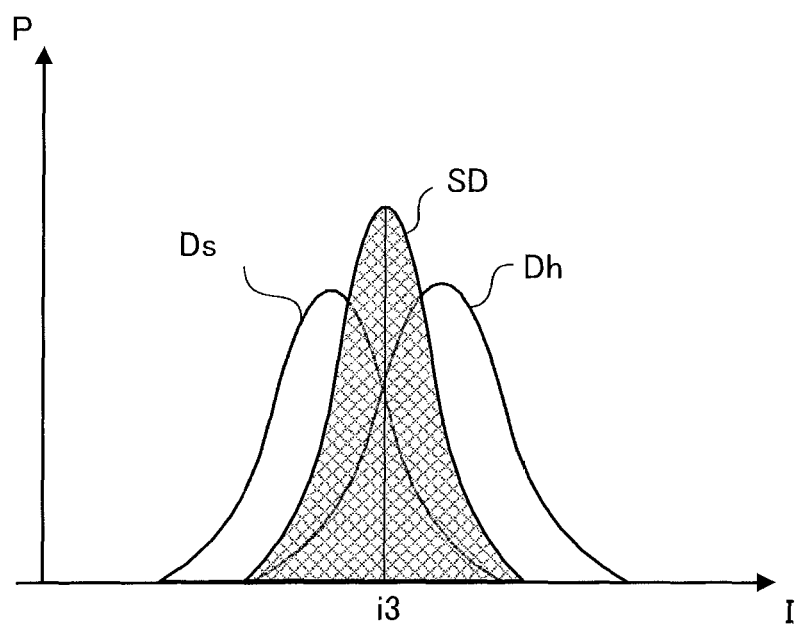
FIG. 4B is a second diagram schematically illustrating the processing contents of the synthesis unit.

Next, the processing contents of the synthesis unit 13 shown in FIG. 3 will be described with reference to FIGS. 4A and 4B. FIG. 4A and FIG. 4B are schematic diagrams 1 and 2 showing the processing contents of the synthesis unit 13.

As illustrated in FIG. 4A, when the current value detected by the system of the shunt resistor 30 is i1, the synthesis unit 13 generates a probability distribution Ds which is a normal distribution in which i1 is an average (μ) and a standard deviation (σ) corresponding to the shunt resistor 30 in the probability distribution information 21.

In addition, in a case where the current detected by the system of the Hall elements 40 is a i2, the synthesis unit 13 generates a probability distribution Dh that is a normal distribution in which the i2 is an average (μ) and a standard deviation (σ) corresponding to the Hall elements 40 in the probability distribution information 21 is a standard deviation.

Subsequently, as illustrated in FIG. 4B, the synthesis unit 13 generates a synthesized distribution SD for the current axis (I-axis). To be specific, the probability distributions Ds and Dh shown in the FIG. 4A are combined on the probability axis (P-axis) to generate the synthesized distribution SD. Then, the synthesis unit 13 outputs the generated synthesized distribution SD to the estimation unit 14. I3, which is the average (μ) of the synthesized distribution SD, may be used as the output value of the current detection apparatus 100.

Figure 5:
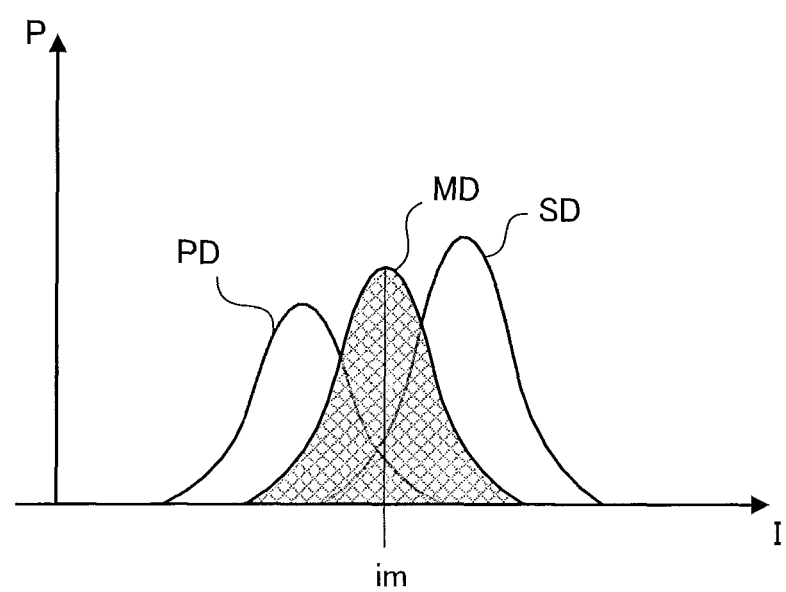
FIG. 5 is a schematic diagram showing processing contents of the estimation unit and the prediction unit.

Next, processing contents of the estimation unit 14 and the prediction unit 15 shown in FIG. 3 will be described with reference to FIG. 5. FIG. 5 is a schematic diagram illustrating processing contents of the estimation unit 14 and the prediction unit 15. The synthesized distribution SD illustrated in FIG. 5 is the current synthesized distribution SD received by the estimation unit 14 from the synthesis unit 13. The predicted distribution PD illustrated in FIG. 5 is the current predicted distribution PD received from the prediction unit 15.

The estimation unit 14 generates the maximum likelihood distribution MD by synthesizing the synthesized distribution SD received from the synthesis unit 13 and the predicted distribution PD received from the prediction unit 15 with respect to the probability axis (P axis). Then, the estimation unit 14 stores the generated maximum likelihood distribution MD in the storage unit 20 as the learning information 22, and outputs im, which is the average (μ) of the maximum likelihood distribution MD, to the output unit 16.

As described above, since the estimation unit 14 synthesizes the synthesized distribution SD corresponding to the current value and the predicted distribution PD corresponding to the current value prediction predicted from the past synthesized distribution SD, it is possible to obtain the most likely current value reflecting the variation history from the past.

Figure 6:
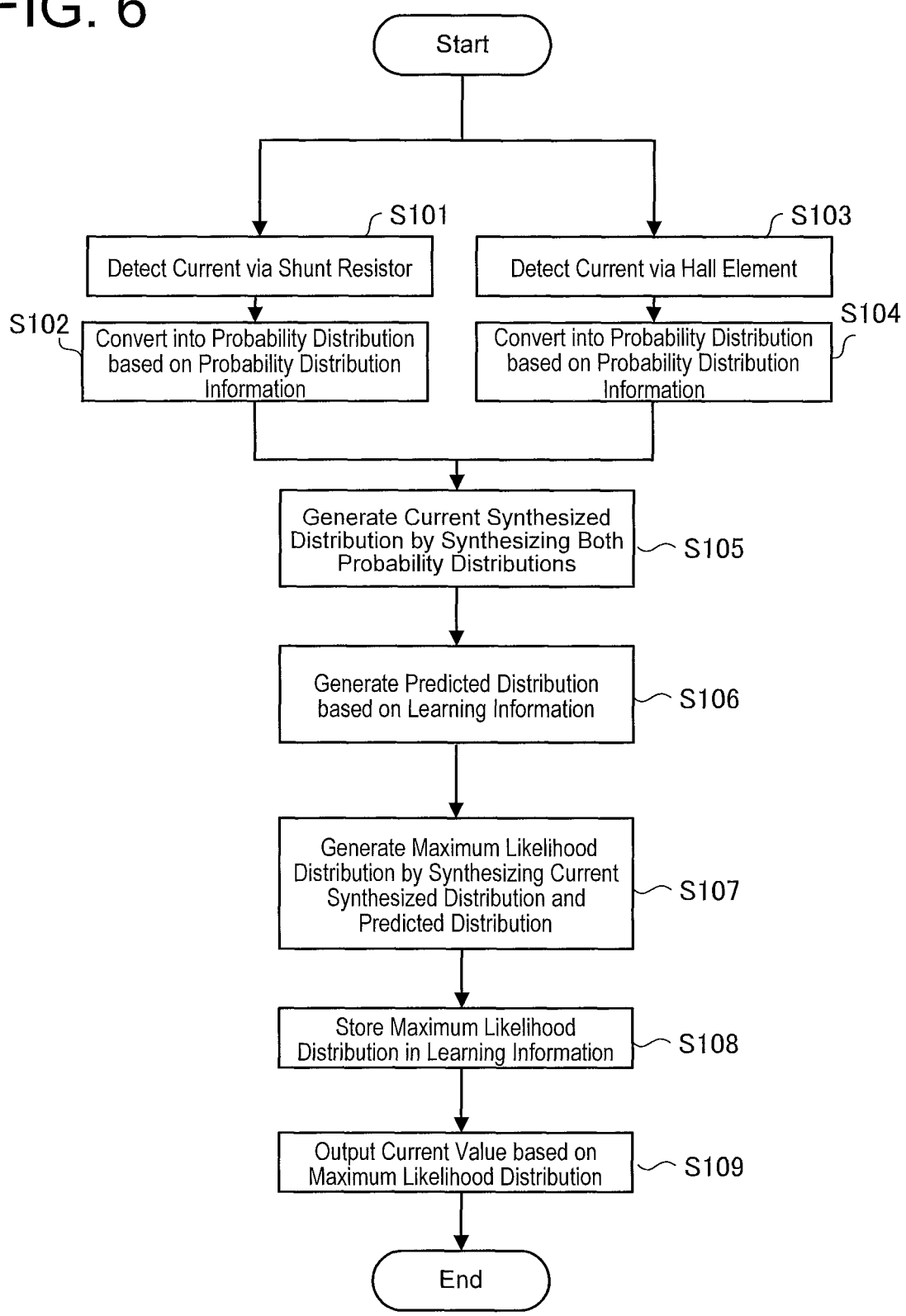
FIG. 6 is a flowchart showing a processing procedure executed by the current detection apparatus.

Next, a processing procedure executed by the current detection apparatus 100 will be described with reference to FIG. 6. FIG. 6 is a flowchart illustrating a processing procedure executed by the current detection apparatus 100. The current detection apparatus 100 repeats the processing procedure illustrated in FIG. 6 at each sampling timing.

As illustrated in FIG. 6, the current detection apparatus 100 detects a current via the shunt resistor 30 (step S101) and converts a detected value into a probability distribution based on the probability distribution information 21 (step S102). Further, the current detection apparatus 100 detects a current via the Hall element 40 (step S103), and converts the detected value into a probability distribution based on the probability distribution information 21 (step S104). Note that step S101 to step S102 and step S103 to step S104 are executed in parallel.

Subsequently, the synthesis unit 13 generates the current synthesized distribution by synthesizing the probability distributions of the step S102 and the step S104 (step S105). Then, the prediction unit 15 generates a predicted distribution based on the learning information 22 (step S106). Further, the estimation unit 14 generates a maximum likelihood distribution by synthesizing the current synthesized distribution in step S105 and the predicted distribution in step S106 (step S107).

In addition, the estimation unit 14 stores the maximum likelihood distribution in the step S107 in the learning information 22 (step S108), and the output unit 16 outputs a current value based on the maximum likelihood distribution in the step S107 (step S109), and ends the process.

Although the case where the current detection apparatus 100 detects a current by a combination of the shunt resistor and the Hall element has been described above, different combinations of detection elements may be used.

In the following, variations of combinations of detection elements will be described with reference to FIG. 7. FIG. 7 is a diagram showing an example of combination of detection elements. The combination illustrated in Example 1 of FIG. 7 is a combination corresponding to the current detection apparatus 100 described in FIGS. 2 to 6.

As shown in FIG. 7, "Example 1" is a case where the shunt resistor is used as the first detection element and the Hall element is used as the second detection element. In the case of the combination of Example 1, as described above, current detection targets are an alternating current and a direct current. In addition, the performance such as responsiveness and accuracy is good.

Example 2 is an example in which a "current transformer" is used instead of the Hall element of Example 1. That is, the shunt resistor is used as the first detection element, and the current transformer is used as the second detection element. In the case of the combination of Example 2, the detection target is limited to alternating current, unlike the case of Example 1. The performances such as responsiveness and accuracy are good as in Example 1.

Example 3 is an example in which a "current transformer" is used instead of the shunt resistor of Example 1. That is, the current transformer is used as the first detection element and the Hall element is used as the second detection element. In the case of the combination of Example 3, the detection target is limited to alternating current as in the case of Example 2. In addition, the performance such as responsiveness and accuracy is inferior to those of Example 1 and Example 2 because both elements are of a type affected by electromagnetic noise.

Figure 8:
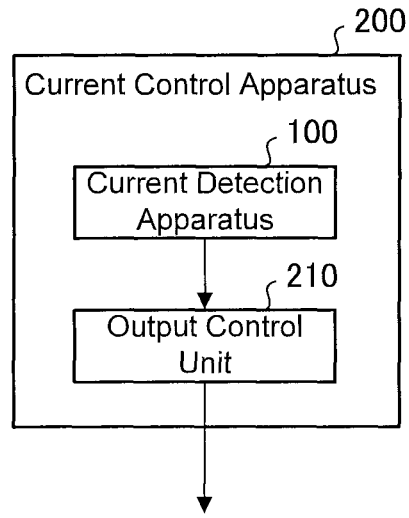
FIG. 8 is a block diagram showing a configuration of the current control apparatus.
Figure 9:
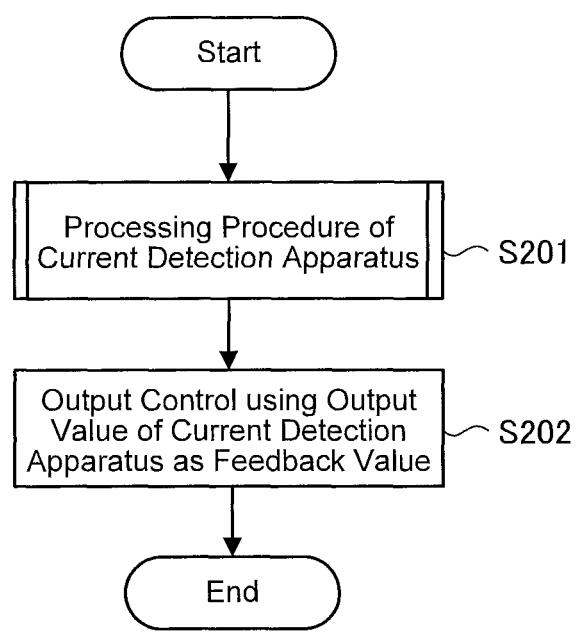
FIG. 9 is a flowchart showing a processing procedure executed by the current control apparatus.

A current control apparatus 200 including the current detection apparatus 100 described above may be configured. A current control apparatus 200 including the current detection apparatus 100 will be described below with reference to FIGS. 8 and 9. FIG. 8 is a block diagram showing a configuration of the current control apparatus 200, and FIG. 9 is a flowchart showing a processing procedure executed by the current control apparatus 200.

As illustrated in FIG. 8, the current control apparatus 200 includes the current detection apparatus 100 and an output control unit 210. Since the configuration of the current detection apparatus 100 has been described with reference to FIG. 3 and the like, the description thereof is omitted here. The output control unit 210 controls the output current based on the current output from the current detection apparatus 100.

For example, the output control unit 210 uses the current value detected by the current detection apparatus 100 as a feedback value to perform control for bringing the output current close to the target current. Here, it is assumed that the output control unit 210 performs PI (proportional integral) control. P (proportional) control or PID (proportional-integral-derivative) control may be performed instead of the PI control.

In this way, since the current control apparatus 200 performs current control using the current detected by the current detection apparatus 100 having high current detection accuracy, it is possible to increase the accuracy of current control. Although FIG. 8 illustrates a case where one current detection apparatus is provided, the current control apparatus 200 may include a plurality of current detection apparatuses 100.

As shown in FIG. 9, the current control apparatus 200 executes the processing procedure of the current detection apparatus 100 (see step S101 to step S109 in FIG. 6) (step S201). Subsequently, the output control unit 210 performs output control using the output value of the current detection apparatus 100 as a feedback value (step S202), and ends the processing.

As described above, the current detection apparatus 100 according to the embodiment includes the first current detection unit 11, the second current detection unit 12, the storage unit 20, the synthesis unit 13, the estimation unit 14, and the output unit 16. The first current detection unit 11 detects a current flowing through the conductive wire 5 to be targeted for detection by the shunt resistor 30. The second current detection unit 12 detects a current by the Hall element 40. The storage unit 20 stores a probability distribution indicating uncertainty of each detected value detected by the first current detection unit 11 and the second current detection unit 12. The synthesis unit synthesizes probability distributions respectively corresponding to the detected values. The estimation unit 14 performs maximum likelihood estimation of current based on the synthesized distribution obtained by the synthesis unit 13. The output unit 16 outputs the current estimated by maximum likelihood method.

As described above, according to the current detection apparatus 100 of the embodiment, the detected value by the shunt resistor 30 and the detected value by the Hall element 40 are handled as probability distributions, and the current value is estimated from the synthesized distribution obtained by synthesizing both distributions. That is, since the maximum likelihood (estimation of the most likely current value) in the current axis direction is performed on the probability distribution, the accuracy of current detection can be improved.

The current control apparatus 200 according to the embodiment includes the current detection apparatus 100 and the output control unit 210. The output control unit 210 controls the output current based on the current output from the current detection apparatus 100. As described above, according to the current control apparatus 200 of the embodiment, since the output current is controlled based on the current output from the current detection apparatus 100, the accuracy of the current control can be improved.

In the above-described embodiment, the number of shunt resistors 30 or the number of Hall elements 40 are one. However, the current detection apparatus 100 or the current control apparatus 200 including a plurality of shunt resistors 30 or a plurality of Hall elements 40 may be configured.

Further effects and modifications can be easily derived by those skilled in the art. Therefore, the broader aspects of the present invention are not limited to the specific details and representative examples shown and described above. Accordingly, various modifications may be made without departing from the spirit or scope of the general inventive concept as defined by the appended claims and their equivalents.

As used herein, the term "comprise" and its variations are intended to mean open-ended terms, not excluding any other elements and/or components that are not recited herein. The same applies to the terms "include", "have", and their variations.

As used herein, a component suffixed with a term such as "member", "portion", "part", "element", "body", and "structure" is intended to mean that there is a single such component or a plurality of such components.

As used herein, ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

As used herein, approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

As used herein, the phrase "at least one of A and B" is intended to be interpreted as "only A", "only B", or "both A and B".

Obviously, numerous modifications and variations of the present disclosure are possible in light of the above teachings. It is therefore to be understood that within the scope of the appended claims, the present disclosure may be practiced otherwise than as specifically described herein.

What is claimed is:

1. A current detection apparatus comprising:
   first current detection circuitry configured to detect a current flowing through a conductive wire with a shunt resistor connected to the conductive wire to obtain a first detected current value;
   second current detection circuitry configured to detect the current with a Hall element to obtain a second detected current value;
   a storage configured to store a first probability distribution information indicating uncertainty of a detected current value detected by the first current detection circuitry and a second probability distribution information indicating uncertainty of a detected current value detected by the second current detection circuitry;
   synthesis circuitry configured to convert the first detected current value into a first probability distribution based on the first probability distribution information, to convert the second detected current value into a second probability distribution based on the second probability distribution information, and to synthesize the first probability distribution and the second probability distribution to obtain a synthesized distribution; and
   estimation circuitry configured to obtain an estimated current value via a maximum likelihood estimation based on the synthesized distribution.

2. The current detection apparatus according to claim 1, wherein the estimation circuitry is configured to obtain the estimated current value based on an updated synthesized distribution obtained by updating a current synthesized distribution with a past synthesized distribution via Bayesian updating.

3. The current detection apparatus according to claim 2, further comprising:
   prediction circuitry configured to predict a predicted distribution based on learning information, the storage being configured to store the past synthesized distribution as the learning information, wherein the estimation circuitry is configured to obtain the estimated current value by synthesizing the predicted distribution and the current synthesized distribution.

4. The current detection apparatus according to claim 1, further comprising:
   first phase shifting circuitry provided on an output line of the shunt resistor; and
   second phase shifting circuitry provided on an output line of the Hall element.

5. The current detection apparatus according to claim 1, wherein an output line of the shunt resistor and an output line of the Hall element do not have a noise filter.

6. A current detection method, comprising:
   detecting a current flowing through a conductive wire with a shunt resistor connected to the conductive wire to obtain a first detected current value;
   detecting the current with a Hall element to obtain a second detected current value;
   storing a first probability distribution information indicating uncertainty of a detected current value detected by the first current detection circuitry and a second probability distribution information indicating uncertainty of a detected current value detected by the second current detection circuitry;
   converting the first detected current value into a first probability distribution based on the first probability distribution information;
   converting the second detected current value into a second probability distribution based on the second probability distribution information;
   synthesizing the first probability distribution and the second probability distribution to obtain a synthesized distribution; and
   obtaining an estimated current value via a maximum likelihood estimation based on the synthesized distribution.

7. A current control apparatus, comprising:
   the current detection apparatus according to claim 1; and
   an output control circuitry configured to control an output current based on the estimated current value.

8. A current control method, comprising:
   detecting a current flowing through a conductive wire with a shunt resistor connected to the conductive wire to obtain a first detected current value;
   detecting the current with a Hall element to obtain a second detected current value;
   storing a first probability distribution information indicating uncertainty of a detected current value detected by the first current detection circuitry and a second probability distribution information indicating uncertainty of a detected current value detected by the second current detection circuitry;
   converting the first detected current value into a first probability distribution based on the first probability distribution information;
   converting the second detected current value into a second probability distribution based on the second probability distribution information;
   synthesizing the first probability distribution and the second probability distribution to obtain a synthesized distribution;
   obtaining an estimated current value via a maximum likelihood estimation based on the synthesized distribution; and
   controlling an output current based on the estimated current value.

9. The current detection apparatus according to claim 1, further comprising:
   output circuitry configured to output the estimated current value.

10. The current detection method according to claim 6, further comprising:
    outputting the estimated current value.

* * * * *